United States Patent [19]

Beauducel et al.

[11] Patent Number: 4,503,526
[45] Date of Patent: Mar. 5, 1985

[54] DEVICE FOR WATER INFLOW DETECTION INSIDE A SEISMIC STREAMER

[75] Inventors: Claude Beauducel, Henouville; Jacques Cretin, Le Chesnay; Alain Ausset, Le Vesinet; Gabriel Ringot, Courbevoie, all of France

[73] Assignees: Institut Francais du Petrole, Rueil-Malmaison; Compagnie Generale de Geophysique, Massy, both of France

[21] Appl. No.: 394,982

[22] Filed: Jul. 2, 1982

[30] Foreign Application Priority Data

Jul. 2, 1981 [FR] France ............................ 81 13212

[51] Int. Cl.³ .......................... G01V 1/38; G01R 31/02
[52] U.S. Cl. ......................................... 367/20; 324/51; 367/13
[58] Field of Search ............................ 367/13, 20, 18; 324/51–54, 65 R; 174/11 R; 200/61.04, 61.05, 61.06; 340/604, 605

[56] References Cited

U.S. PATENT DOCUMENTS

| | | | |
|---|---|---|---|
| 3,351,898 | 11/1967 | Romberg | 367/13 |
| 3,858,114 | 12/1974 | Voellmin et al. | 324/54 |
| 4,366,561 | 12/1982 | Klein | 367/13 |

Primary Examiner—Maynard R. Wilbur
Assistant Examiner—K. R. Kaiser
Attorney, Agent, or Firm—Millen & White

[57] ABSTRACT

Water inflow inside a seismic streamer may create parasitic electric connections between lines supplying current to the electronic devices of the streamer and lines transmitting seismic informations, thus damaging the electronic apparatus and making these informations inaccurate. In accordance with the invention streamer sections including sections of supply lines and transmission lines are provided with water inflow detection assemblies, each comprising a closed circuit element surrounding the supply lines, a conducting line connected to a DC voltage generator, and means for detecting any DC voltage therebetween resulting from parasitic connections between the supply lines and the closed circuit element, created by a water inflow.

8 Claims, 5 Drawing Figures

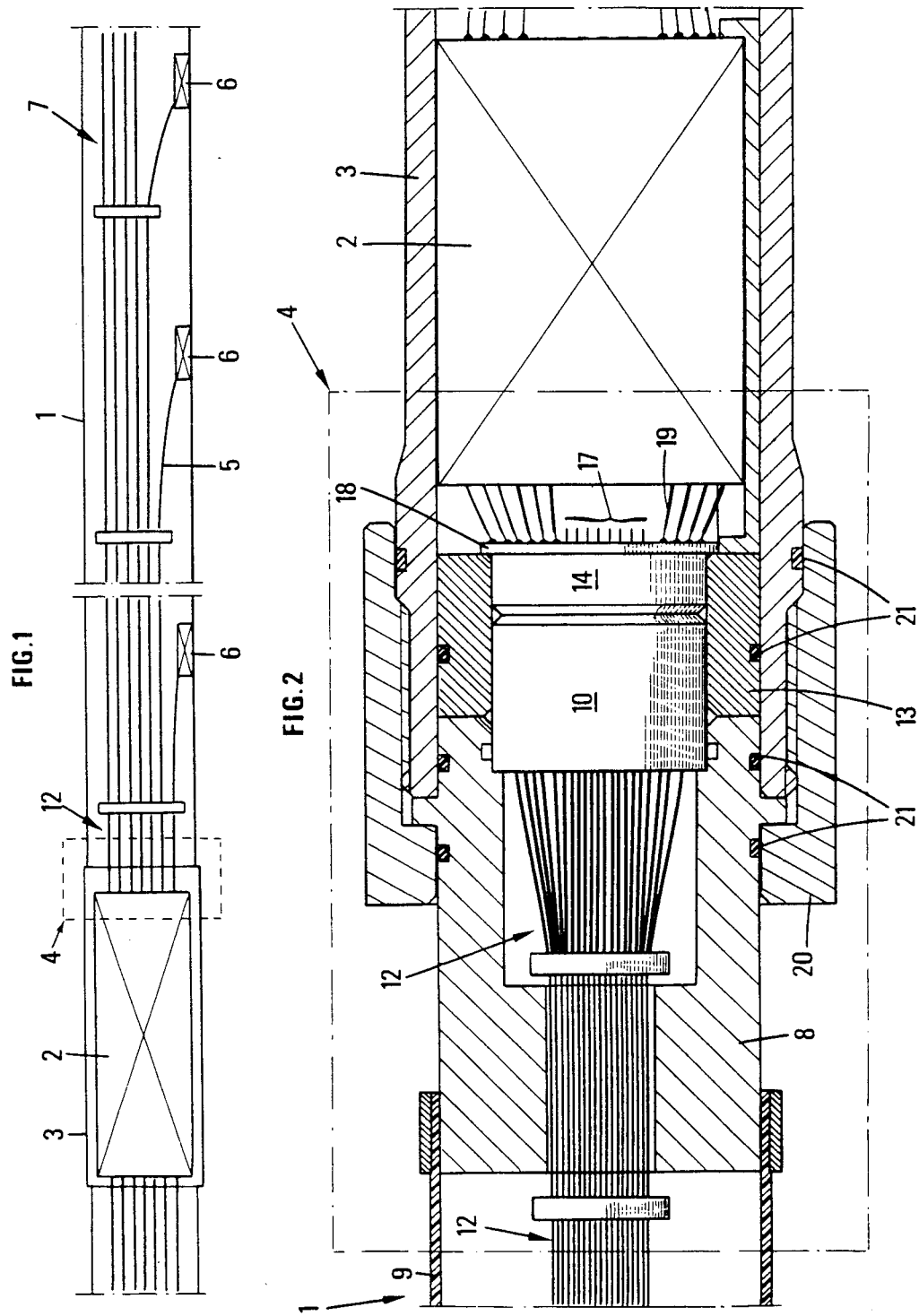

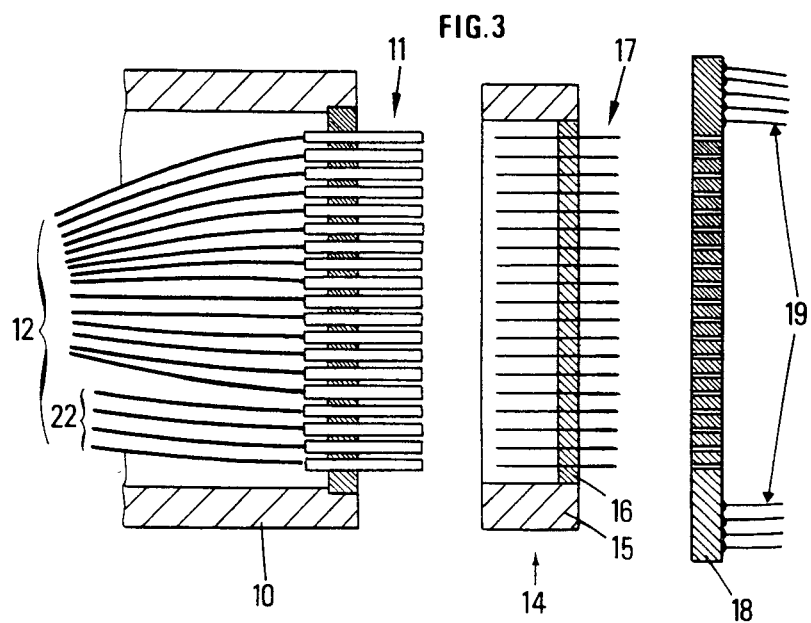
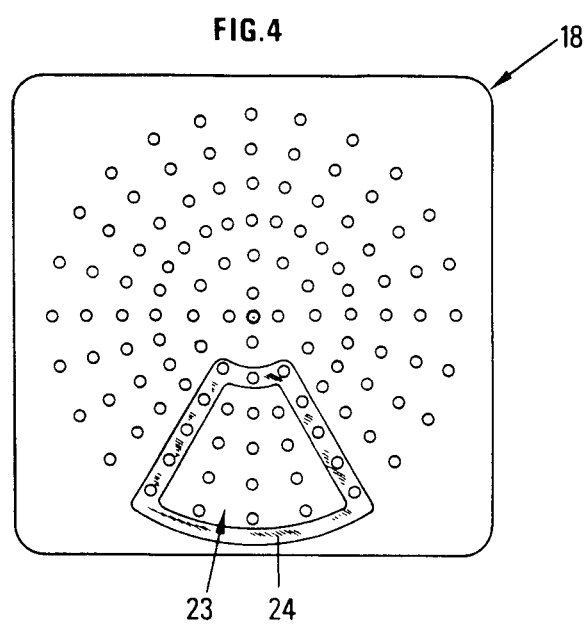

DEVICE FOR WATER INFLOW DETECTION INSIDE A SEISMIC STREAMER

BACKGROUND OF THE INVENTION

The invention has as an object to provide a device for detecting water inflow inside a seismic streamer.

More particularly, the invention concerns a device for detecting parasitic electric connections occurring between conductor wires contained in the different sections of a seismic streamer, as a result of a water penetration therein, due to a sealing defect.

The prior art marine seismic prospecting methods generally comprise the transmission of acoustic waves through water, the reception of the echoes of said seismic waves after reflections on different layers or mirrors of submerged formations and their recording. The reception of echoes is effected by means of receivers in a seismic streamer of great length formed of a plurality of interconnected streamer sections. Each streamer section comprises a tight tubular sheath provided at each end with a connecting device. Each streamer section or some of them comprise a plurality of seismic wave receivers (hydrophones), or groups of electrically interconnected receivers, arranged at regular intervals inside the sheath. Conducting wires connect the hydrophones or hydrophone groups to electric connectors arranged in each connecting device. The different hydrophone groups of the seismic streamer may either be directly connected to a recording system placed on a towing ship or, in the more recent prior art seismic streamers, to local data acquisition devices formed of electronic assemblies adapted to collect the signals received at a certain number of seismic signal receivers and to transmit them sequentially to the recording system. These local acquisition devices are included in the seismic streamer sections containing the seismic receivers, or in particular sections intercalated between the sections containing the seismic receivers. An acquisition device of this type is described for example in the French published patent application No. 2,471,088.

The different streamer section are filled with an electrically insulating liquid. If, for any reason, the sealing of the sheath is not perfectly achieved, water penetrating inside may establish parasitic electric connections between the conductors transmitting the seismic signals. Moreover, when the seismic streamer comprises a plurality of local seismic data acquisition devices fed with current from the ship through supply lines, the water may establish electric connections between these lines and the conductors used for the transmission of seismic data, which may have as effect to damage the electronic apparatus forming the data acquisition devices.

A known process for detecting a possible water inflow inside a seismic streamer section consists of placing inside the section two parallel electric conductors whose insulating sheath is provided with holes at regular intervals and of connecting these conductors to a current source. The water having penetrated inside the streamer section creates shunts between the holes of the insulating sheath, thereby varying the electric voltage between the two conductors. The variations of this electric voltage, if any, are transmitted permanently or intermittently to a monitoring device placed on the towing ship.

SUMMARY OF THE INVENTION

The device according to the invention is particularly adapted for detecting parasitic electric connections created by water penetrating into a seismic streamer, as a result of a sealing defect, between the lines supplying electricity to the electronic acquisition devices, placed in the streamer for collecting the seismic signals generated by the receiver assemblies distributed inside the streamer, and the seismic signal transmission lines connecting the signals acquisition devices to the receivers on the one hand and to a control and recording assembly, placed on the ship towing the submerged seismic streamer, on the other hand. The supply lines are connected to electric supply means and comprise, as well as the transmission lines, a plurality of sections connected through electric connection assemblies.

The device is characterized in that it comprises a plurality of detection assemblies, each constituted of a closed circuit element surrounding the assembly of the supply lines connected to each electric connection assembly, of a conducting line connected to electric supply means comprising a DC voltage generator and means for detecting any DC voltage between each closed circuit element and the conducting line resulting from parasitic electric connections between the supply lines and said closed circuit element, and means for transmitting to the ship the detected electric voltages.

The water penetrating inside the seismic streamer sections has generally little parasitic effects on the different seismic receivers and the transmission and supply lines contained therein, since they are protected by tight sheaths. On the contrary, the connectors are not so well protected and water infiltrations inside a streamer section may result in short-circuits between the pins, particularly detrimental to the electronic apparatus.

The combination of the closed circuit element separating the supply lines from the other transmission lines also secured to each connector of the DC voltage generator, with the conducting line and the detection means, makes it possible to immediately identify the abnormal conducting connections between the supply and the input or outputs of the local acquisition devices.

The means for detecting parasitic electric voltages comprises advantageously opto-electronic elements for generating auxiliary voltages in response to DC voltages. The input terminals of these elements are electrically insulated from the circuits of each of the acquisition devices, thus making possible, if so desired, to make independent the electric supply of the latter.

If, in addition, the conducting line is common to all the detection assemblies and is connected to a terminal of the DC voltage generator, through an electric resistor, there will be obtained, by measuring the electric voltage at the terminals thereof, a signal indicative of the leakage current derived from the supply lines, the precise location where it is produced being localized by the auxiliary voltage supplied by the opto-electronic elements which have reacted to the short-circuit.

BRIEF DESCRIPTION OF THE DRAWINGS

Other characteristics and advantages will be made apparent from the following description of a preferred embodiment of the device of the invention, described by way of non-limitative example, with reference to the accompanying drawings wherein:

FIG. 1 diagramatically shows the connection of a seismic streamer section to a particular section containing a local seismic data acquisition device;

FIG. 2 diagrammatically shows a longitudinal cross-sectional view of a system for connecting the end of a seismic streamer section to the end of a particular section containing a data acquisition device, said particular section consisting of a tubular casing;

FIG. 3 diagrammatically shows a longitudinal cross-section of elements of the electric connection assembly placed in the connecting system, whereby the conductors of a seismic streamer section can be electrically connected to different inputs or outputs of the data acquisition device;

FIG. 4 diagrammatically shows a transverse view of the closed circuit device surrounding the assembly of the supply line connected to each electric connection assembly.

DETAILED DISCUSSION OF THE INVENTION

Figure 5:
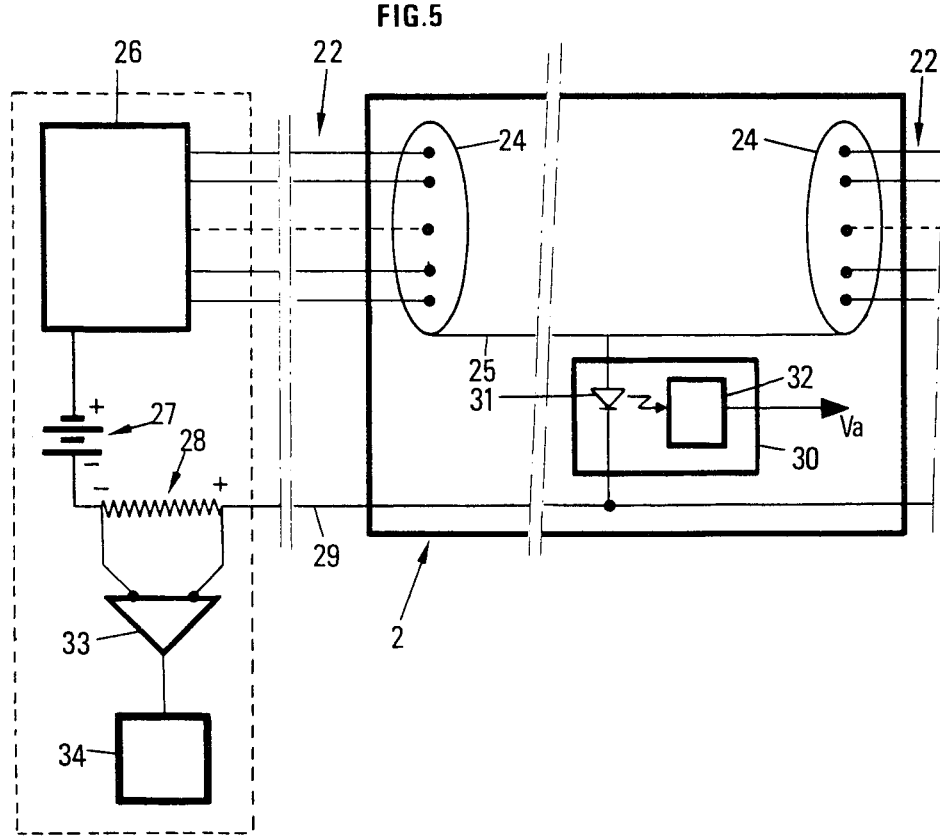
FIG. 5 diagrammatically shows the circuits associated to a closed circuit element for the detection of parasitic electric connections.

The seismic streamer section 1, shown in FIG. 1, is connected, by at least one of its ends, with a local seismic data acquisition device 2, contained in a tubular casing 3, through a connection system 4 described more in detail with reference to FIG. 2. To this acquisition device 2 is connected a wire bundle 12 formed, on the one hand, of conducting wires 5 coming from at least a part of the wave receivers 6 placed in the streamer section 1 at regular intervals and, on the other hand, of a plurality of conducting wires 7, coming from other acquisition devices distributed along the seismic streamer and used for their electric supply or for the transmission of seismic data.

The connection system shown in cross-section in FIG. 2 provides for both a mechanical and electrical interconnection of the terminal portion of each seismic streamer section 1 to a local data acquisition device 2. The terminal portion of each section comprises an endpiece 8 to which is connected the sheath 9 of section 1 of the streamer, and a female electric connector 10 comprising a plurality of cavities 11 (FIG. 3). On this female connector is welded a bundle 12 of conducting wires consisting of the conductors 5 and 7 connected (FIG. 1) to the seismic receivers located in the streamer section 1 and to the data acquisition devices located on any side in the seismic streamer.

The tubular casing 3 containing each data acquisition device 2 is closed by a ring 13 at the vicinity of each of its ends. At the central portion of ring 13 is secured a male electric connector 14 comprising an annular part 15 (FIG. 3) and a central part formed of a glass disc 16 wherein are embedded pins 17 adapted to fit in the cavities 11 of the connector 10. On the side of the connector 14 facing the acquisition device 2, is placed a plate 18 provided with holes (FIG. 2) wherein the pins 17 are adapted to fit.

To the periphery of the plate 18 are secured conductor wires 19 connected to the different elements of the acquisition device 2, inside casing 3. The plate 18 is advantageously formed of a multiple layer printed circuit whereby appropriate connections may be easily established between the conductor wires 19 and the different holes of said plate, the latter being covered with a conducting coating. The connectors 10 and 14 and the plate 18 form an electric interconnection assembly.

A threaded ring 20 is adapted to be screwed on the terminal part of each tubular casing 3 and to secure the latter to the endpiece 8 of the corresponding seismic streamer section. A plurality of sealing joints 21, placed inside grooves arranged in the different parts of each connection system, insulate the inside of the steamer from the external medium.

However, when, as a result of a defective sealing, humidity penetrates inside one of the connection systems up to the electric connector 10, 14 and 18, the detection of possible parasitic electric connections is effected by a detection assembly such as described below.

In each interconnection assembly (FIGS. 3 and 4) the conductor wires 22 of the bundle 12, used for the electric supply of the electronic acquisition device 2, are connected to adjacent pins. These pins fit in an assembly 23 of holes of the multiple layer printed circuit forming the plate 18 and bring their conducting coatings to the different supply electric potentials. They are separated from the other pins by a closed circuit element called guard-ring. This circuit element is formed (FIG. 4) by interconnecting through a conducting strip 24, engraved on one of the conducting layers of the multiple layer printed circuit, the conducting coatings of the holes located at the periphery of assembly 23.

When the elements 10, 14 and 18 of each interconnection assembly fit together, the pins and the cavities corresponding to the supply wires 22 are thus separated from those to which are connected the other wires of bundle 12 used for data transmission, by the closed circuit element 24. When humidity establishes a parasitic electric connection between one of the supply wires 22 and other conducting wires of the bundle 12, the closed circuit element 24 is brought to the potential of said supply wire.

According to the diagram of FIG. 5, the closed circuit elements (or guard-rings) 24, placed around the supply wires 22 in the electric connectors located at both ends of each casing 3, are interconnected through a conductor 25 and the assembly of the electric supply lines formed by electrically interconnecting the supply wires 22 of the different streamer sections 20 and the casings 3 is connected to an electric current generator 26 placed for example on a ship. The supply of the different casings of the streamer may be effected with direct current or with alternating current. In the latter case, the generator 26 is connected to the positive terminal of a DC voltage source 27. The negative terminal of the source 27 is connected through a resistor 28 to a conducting line 29 provided over the whole length of the seismic streamer. Inside each casing 3, a detection element 30 is connected between the conductor 25 interconnecting the closed circuit elements 24 and the conducting line 29. Said detection element is preferably an opto-electronic coupling element formed, in a known manner, of a photo-transmitting element 31 associated with a photo-receiving element 32. The photo-transmitting element 31 is fed with the direct current which may appear in conductor 25 as the result of a parasitic electric connection created by the humidity. In response to the lighting of the photo-transmitting element 31, the associated photo-receiving element 32 generates an electric voltage Va which is transmitted to the ship through one of the transmission lines associated to each casing 3, either in a continuous manner, or in a discontinuous manner when the signals transmitted by the local acquisition device 2 are multiplexed.

The use of a DC voltage generator makes it possible to differentiate the electric voltages due exclusively to parasitic conductions from the voltages induced in the return line by capacitive coupling between the latter and lines 22, in the case where these lines are fed with alternating current.

The detection device further comprises a short-circuit indicator adapted to measure the electric voltage appearing at the terminal of the resistor 28, switched in conducting line 29. This indicator comprises an amplifier 33 adapted to amplify the electric voltage at the terminals of resistor 28, associated with an appropriate signaling element 34. The signal generated by the latter permits detection of the occurrence of a short-circuit on the lines, the precise localization of the place at which it is produced being obtained from the auxiliary voltage generated by the concerned opto-electronic coupling element. The different signals generated by the detection device may be associated for controlling the interruption of the electric supply.

It would not be outside the scope of the invention to replace the conducting line engraved on the multiple layer printed circuit 18 and forming the guard-ring by any other conducting means.

What is claimed is:

1. A device for detecting water leaks into a seismic streamer comprising a plurality of streamer sections interconnected by means of connection assemblies, said seismic streamer further comprising assemblies of seismic receivers, data electronic acquisition systems for collecting signals generated by the assemblies of seismic receivers, signal transmission lines for connection of the assemblies of seismic receivers to the acquisition systems and for the connection of the acquisition systems to a control and recording assembly located on a vehicle towing the seismic streamer, and further comprising electric feeding lines connected to an electric power supply means for feeding said acquisition systems, said electric feeding lines and said transmission lines each comprising a plurality of line sections joined together by means of said connection assemblies, and said device constructed for detecting water leaks by detecting produced parasitic electric currents between said electric feeding lines and said transmission lines, the device comprising DC voltage generating means one terminal of which being permanently connected to said electric feeding lines, a plurality of detection assemblies corresponding to and respectively disposed in the plurality of connection assemblies, each of said detection assemblies having a closed circuit element surrounding the electric feeding line sections, a conducting line connected to another terminal of said DC voltage generating means, detecting means for detecting any DC voltages between each closed circuit element and said conducting line resulting from parasitic connections between the electric feeding lines and said closed circuit element, and transmitting means for transmitting to the vehicle any detected electric voltages.

2. A device for detecting water leaks into a seismic streamer comprising a plurality of streamer sections interconnected by means of connection assemblies, said seismic streamer further comprising assemblies of seismic receivers, data electronic acquisition systems for collecting signals generated by the assemblies of seismic receivers, signal transmission lines for connection of the assemblies of seismic receivers to the acquisition systems and for the connection of the acquisition systems to a control and recording assembly located on a vehicle towing the seismic streamer, and further comprising electric feeding lines connected to an electric power supply means for feeding said acquisition systems, said electric feeding lines and said transmission lines each comprising a plurality of line sections joined together by means of said connection assemblies, and said device constructed for detecting water leaks by produced parasitic electric currents between said electric feeding lines and said transmission lines, the device comprising DC voltage generating means, a plurality of detection assemblies corresponding to and respectively disposed in the plurality of connection assemblies, each of said detection assemblies having a closed circuit element surrounding the electric feeding line sections, a conducting line connected to said DC voltage generating means, detecting means for detecting any DC voltages between each closed circuit element and said conducting line resulting from parasitic connections between the electric feeding lines and said closed circuit element, with said detecting means comprising opto-electronic elements for generating auxiliary electric voltages in response to said detected DC voltages, and transmitting means for transmitting to the vehicle any detected electric voltages.

3. A detection device according to claim 2, wherein the conducting line is common to all the detection assemblies and is connected to a terminal of the DC voltage generating means through an electric resistor, said detection device also comprising a short-circuit indicator for measuring the electric voltage at the terminals of said resistor.

4. A device according to claim 2, wherein the opto-electronic elements include a photo-transmitting element connected between each closed circuit element and said conducting line and a photo-receiving element, the transmitting means for transmitting the detected electric voltages to the towing vehicle comprising conductors connecting the output of each photo-receiving element to the seismic signal transmission lines.

5. A device according to claim 3, wherein said electric power supply means comprises a source of alternating current connected in series with said DC voltage generating means.

6. A device for detecting water leaks into a seismic streamer comprising a plurality of streamer sections interconnected by means of connection assemblies, said seismic streamer further comprising assemblies of seismic receivers, data electronic acquisition systems for collecting signals generated by the assemblies of seismic receivers, signal transmission lines for connection of the assemblies of seismic receivers to the acquisition systems and for the connection of the acquisition systems to a control and recording assembly located on a vehicle towing the seismic streamer, and further comprising electric feeding lines connected to an electric power supply means for feeding said acquisition systems, said electric feeding lines and said transmission lines each comprising a plurality of line sections joined together by means of said connection assemblies, each of said connection assemblies comprising a rigid casing enclosing a data acquisition system and an electric connection assembly comprising at least two connectors adapted for interconnections of the electric feeding lines and the transmission lines of each streamer section and of each rigid casing, and said device constructed for detecting water leaks by detecting produced parasitic electric currents between said electric feeding lines and said transmission lines, the device comprising DC voltage generating means, a plurality of detection assemblies corresponding to and respectively disposed in the plurality of connection assemblies, each of said detection assemblies having a closed circuit element surrounding the electric feeding line sections, a conducting line connected to said DC voltage generating means, detecting means for detecting any DC voltages between each closed circuit element and said conducting line resulting from parasitic connections between the electric feeding lines and said closed circuit element, and transmitting means for transmitting to the vehicle any detected electric voltages.

7. A detection device according to claim 6, wherein each of said closed circuit elements surrounding the electric feeding lines is a conducting connection element engraved on one of multiple layers of a multiple layer printed circuit adapted to fit one of said connectors.

8. A device according to claim 7, wherein said closed circuit elements are guard rings encircling a plurality of connecting holes on a plate for connection with a plurality pins connected to the respective transmission and electric feeding lines.

* * * * *